United States Patent
Qiao et al.

(10) Patent No.: US 9,659,602 B2
(45) Date of Patent: May 23, 2017

(54) VOLTAGE CONTROL INTEGRATED CIRCUIT DEVICES

(71) Applicant: Micron Technology, Inc., Boise, ID (US)

(72) Inventors: Liang Qiao, Shanghai (CN); Xinwei Guo, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/241,257

(22) PCT Filed: Apr. 18, 2013

(86) PCT No.: PCT/CN2013/000447
§ 371 (c)(1),
(2) Date: Feb. 26, 2014

(87) PCT Pub. No.: WO2014/169401
PCT Pub. Date: Oct. 23, 2014

(65) Prior Publication Data
US 2015/0029806 A1  Jan. 29, 2015

(51) Int. Cl.
*G11C 5/14*  (2006.01)
*H02M 3/07*  (2006.01)
*H02M 1/00*  (2006.01)

(52) U.S. Cl.
CPC ............. *G11C 5/147* (2013.01); *H02M 3/07* (2013.01); *H02M 2001/0025* (2013.01)

(58) Field of Classification Search
CPC ...................................................... G11C 5/147
(Continued)

(56) References Cited

U.S. PATENT DOCUMENTS 4,954,769 A * 9/1990 Kalthoff .................. G05F 1/467
    323/313
5,553,021 A * 9/1996 Kubono ................. G11C 5/145
    365/185.33
(Continued)

FOREIGN PATENT DOCUMENTS

CN  101707438 A  5/2010
CN  102290984 A  12/2011
CN  102594276 A  7/2012

OTHER PUBLICATIONS

Wikipedia (http://en.wikipedia.org/wiki/Buffer_amplifier, Mar. 19, 2015, at 15:16).*

*Primary Examiner* — Anthan Tran
*Assistant Examiner* — Mushfique Siddique
(74) *Attorney, Agent, or Firm* — Dicke, Billig & Czaja, PLLC

(57) ABSTRACT

Voltage control in integrated circuits include a first voltage divider coupled to receive a reference voltage and having an output providing an adjusted reference voltage; an operational amplifier having a first input coupled to receive the output of the first voltage divider, a second input coupled to receive a feedback voltage, and an output; a voltage generation circuit responsive to the output of the operational amplifier and having an output providing an output voltage; and a second voltage divider coupled to receive the output voltage and having an output providing the feedback voltage. The first voltage divider is responsive to first control signals to adjust a voltage level of the adjusted reference voltage. The second voltage divider is responsive to second control signals to adjust a voltage level of the feedback voltage.

25 Claims, 9 Drawing Sheets

(58) Field of Classification Search
USPC .......................................................... 365/226
See application file for complete search history.

(56) References Cited

U.S. PATENT DOCUMENTS

| | | | | |
|---|---|---|---|---|
| 5,783,934 | A * | 7/1998 | Tran | G05F 3/242 |
| | | | | 323/312 |
| 6,281,665 | B1 * | 8/2001 | Miyaba | G11C 5/147 |
| | | | | 323/224 |
| 6,320,797 | B1 * | 11/2001 | Liu | G11C 5/147 |
| | | | | 365/189.05 |
| 6,936,998 | B2 * | 8/2005 | Cho | G05F 3/242 |
| | | | | 323/280 |
| 7,072,238 | B2 * | 7/2006 | Chae | G11C 16/30 |
| | | | | 365/185.21 |
| 7,170,810 | B1 | 1/2007 | O et al. | |
| 7,248,025 | B2 * | 7/2007 | Adachi | G05F 1/575 |
| | | | | 323/273 |
| 7,692,977 | B2 * | 4/2010 | Kim et al. | 365/189.09 |
| 7,834,306 | B2 | 11/2010 | Shah et al. | |
| 7,889,523 | B2 | 2/2011 | Cook et al. | |
| 7,903,479 | B2 | 3/2011 | Im | |
| 8,035,440 | B2 | 10/2011 | Hernandez-Garduno et al. | |
| 8,189,423 | B2 | 5/2012 | Keeth et al. | |
| 8,633,759 | B2 * | 1/2014 | Sung | H02M 3/07 |
| | | | | 327/536 |
| 8,867,295 | B2 * | 10/2014 | Mera | G11C 5/147 |
| | | | | 365/149 |
| 9,342,087 | B2 * | 5/2016 | Chen | G05F 1/575 |
| 2002/0191472 | A1 * | 12/2002 | Okamoto | G11C 5/147 |
| | | | | 365/227 |
| 2004/0027108 | A1 * | 2/2004 | Schreck | G05F 1/46 |
| | | | | 323/282 |
| 2004/0062127 | A1 * | 4/2004 | Li | H02M 3/073 |
| | | | | 365/226 |
| 2005/0105367 | A1 * | 5/2005 | Kim et al. | 365/226 |
| 2007/0139099 | A1 * | 6/2007 | Pan | H02M 3/07 |
| | | | | 327/536 |
| 2008/0159015 | A1 * | 7/2008 | Kang | G11C 11/4074 |
| | | | | 365/189.09 |
| 2011/0248688 | A1 * | 10/2011 | Iacob | G05F 1/56 |
| | | | | 323/234 |
| 2012/0074505 | A1 * | 3/2012 | Wang | H01L 21/8221 |
| | | | | 257/378 |
| 2012/0105047 | A1 | 5/2012 | Huang et al. | |

* cited by examiner

VOLTAGE CONTROL INTEGRATED CIRCUIT DEVICES

TECHNICAL FIELD

The present disclosure relates generally to integrated circuit devices and, in particular, in one or more embodiments, the present disclosure relates to voltage control in integrated circuit devices.

BACKGROUND

Integrated circuit devices are often designed to operate portions of their circuitry using voltages different than the supply voltages (e.g., reference voltages, core voltages, ground potential, etc.). These non-standard voltages may be generated internally, such as through the use of charge pumps. Charge pumps are circuits that are used to generate a "pumped voltage" having a magnitude that is larger than the magnitude of its supply voltage.

Memory devices are common integrated circuit devices. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of data-storage structures, using charge-storage structures (e.g., floating gates or charge traps) or other physical phenomena (e.g., phase change or polarization), determine the data state of each cell. Common uses for flash memory include personal computers, personal digital assistants (PDAs), digital cameras, digital media players, cellular telephones, solid state drives and removable memory modules, and the uses are growing. A memory device typically utilizes a wide variety of non-standard voltages for the effective and efficient access of its memory cells, such as reading, programming or erasing these memory cells. These voltages may change throughout the life-cycle of the memory device due to age and/or operating conditions of the memory device, for example.

For the reasons stated above, and for other reasons stated below which will become apparent to those skilled in the art upon reading and understanding the present specification, there is a need in the art for alternative apparatus and methods for voltage control in integrated circuit devices.

DETAILED DESCRIPTION

Figure 1:
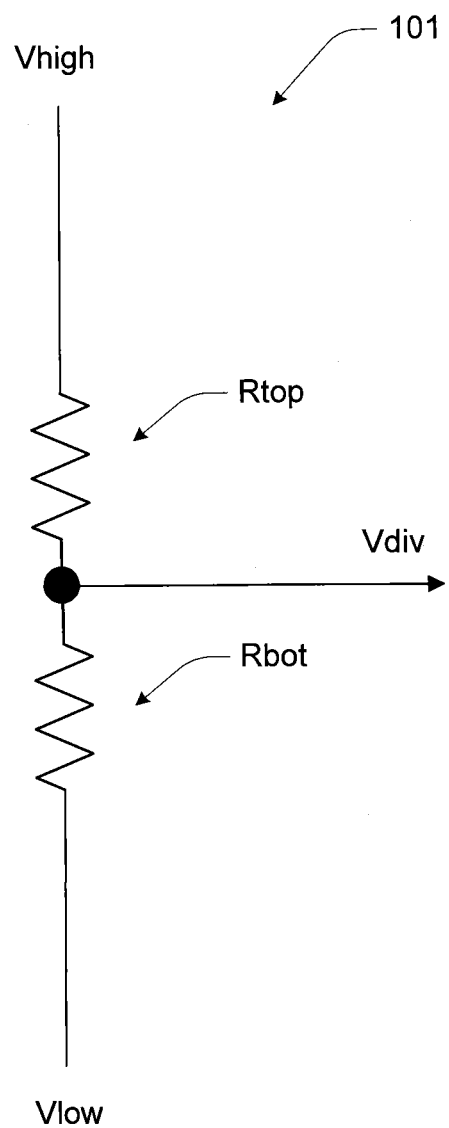
FIG. 1 is a generalized schematic of a voltage divider.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Charge pumps are often utilized to generate voltages internal to an integrated circuit. A typical setup may include one or more pump stages controlled by a variable oscillator. The variable oscillator controls the rate at which the pump stages store and dump charge, thus controlling the output voltage of the pump stages. This oscillator may further be controlled in response to the output of an operational amplifier (op-amp). The op-amp would typically receive a reference voltage to its positive input and a feedback voltage to its negative input. Higher values of the reference voltage generally provide higher values of the output of the op-amp, and thus higher frequencies of the oscillator. In turn, higher frequencies of the oscillator generally provide higher magnitude of the output voltage of the pump stages. The feedback voltage represents a divided output voltage of the pump stages, and facilitates stable voltage output from the pump stages. To provide the feedback voltage, the output voltage may be provided to a voltage divider. The resistance ratio of the voltage divider adjusts the gain of the op-amp, and thus the output voltage of the pump stages. The voltage dividers may be formed of a ladder of discrete resistors in series.

FIG. 1 is a generalized schematic of a voltage divider 101 having a high voltage (Vhigh), a low voltage (Vlow) and a resistor ladder including resistance values Rtop and Rbot in series between Vhigh and Vlow. Resistance values Rtop and Rbot may each represent one or more resistors in series. The output voltage (Vdiv) of the voltage divider 101 can be determined by Equation 1:

$$V\text{div} = (V\text{high} - V\text{low}) * R\text{bot}/(R\text{bot} + R\text{top}) + V\text{low} \qquad \text{Eq. 1}$$

Where Vlow is a ground potential, Equation 1 simplifies to:

$$V\text{div} = V\text{high} * R\text{bot}/(R\text{bot} + R\text{top}) \qquad \text{Eq. 2}$$

Two common resistor ladders include an N-well resistor ladder and a MOSFET resistor ladder. MOSFET resistor ladder is a term of art referring in general to field-effect transistors connected in series, source to drain, with the control gate of each transistor connected to its drain region to operate as a resistor. Although the term MOSFET appears in the name, the term MOSFET is used generally to refer to insulated-gate field-effect transistors, and such resistor ladders may be formed of transistors other than metal-oxide-semiconductor transistors.

For the N-well resistor ladder, resistor value (e.g., resistance) is a function of the L/W (length/width) ratio of the N-well of the N-well resistors, and the number of resistors in series, for Rtop and Rbot, respectively. While a voltage divider in a charge pump feedback loop using an N-well resistor ladder can be readily designed to provide an arbitrary output voltage of the pump stages, disadvantages include a need to provide resistor widths large enough to provide suitable accuracy of the N-well resistors at moderate sheet resistance. This can lead to relatively large layout size where feedback current is limited. In addition, N-well resistor ladders are generally not suitable for use with negative charge pumps as it can lead to forward bias of the P-N junction between resistors.

MOSFET resistor ladders can be utilized in both positive and negative charge pump situations, and their larger resistance values can lead to reduced layout size over N-well resistor ladders. However, providing an arbitrary output voltage of the pump stages typically requires transistors of differing W/L ratios. Forming transistors of differing W/L ratios can lead to a large variation of resistance as a result of process variation. Such variation can reach several hundreds of milliohms in some cases, possibly leading to unacceptable differences in output voltage between integrated circuit devices, or even among voltage control circuits within a single integrated circuit device.

Various embodiments seek to address the challenges of typical voltage control circuits. Various embodiments include voltage control circuits providing both an adjustable feedback voltage as well as an adjustable reference voltage. In this manner, not only can the output voltage approach arbitrary values, but it can also be modified post-fabrication, i.e., without changing a W/L ratio of a resistor. For example, where performance of an integrated circuit incorporating such a voltage control circuit could be improved by reducing or increasing the output voltage of the voltage control circuit, a change in register value (e.g., a trim value) could be used to effect such a change. While prior voltage control circuits could change their output voltages in response to a register value, such as changing an entry or exit point of a voltage divider, because the voltage divider is made up of discrete resistors, the next available entry or exit point may lead to a new output voltage that is higher or lower than desired.

As will be seen, providing both an adjustable reference voltage and an adjustable feedback voltage increases the granularity of available voltages. In addition, increased granularity further facilitates the use of MOSFET ladders using transistors of the same size (i.e., same W/L ratio). Because the output of a resistor ladder is dependent upon the resistance ratio of Rbot and Rtop, using transistors of the same size can mitigate process variation between different voltage control circuits, whether within a single integrated circuit device, or of different integrated circuit devices. For example, where the transistors of a given resistor ladder are fabricated under similar process conditions and to the same size, the ratio of Rbot and Rtop will tend to equate to the ratio of the number of transistors forming Rbot and Rtop, respectively, thus reducing process variability between devices as the ratio becomes independent of fabricated transistor size.

Figure 2:
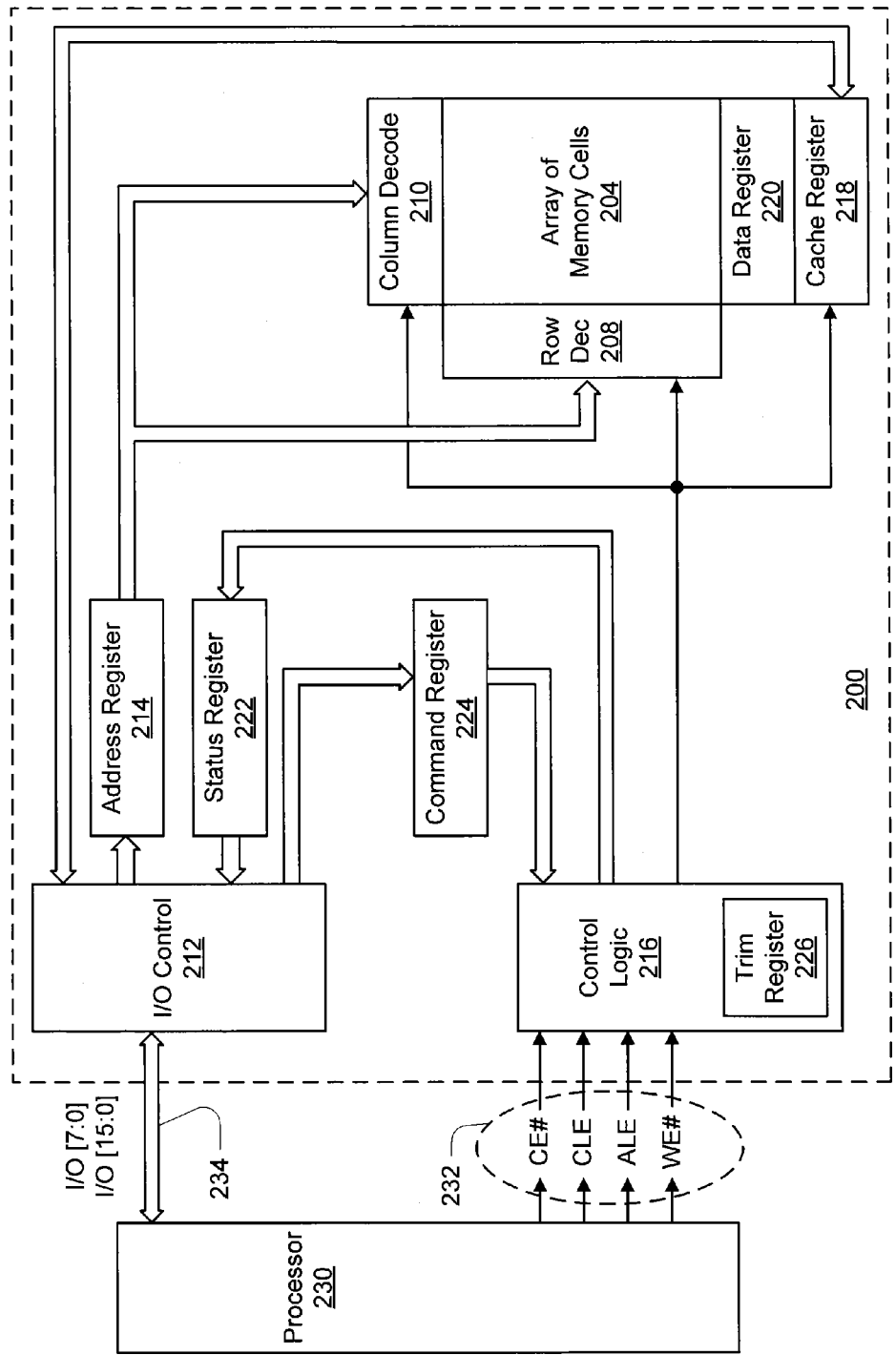
FIG. 2 is a simplified block diagram of a memory device in communication with a controller as part of an electronic system in accordance with an embodiment.

FIG. 2 is a simplified block diagram of a first apparatus (e.g., an integrated circuit) in the form of a memory device 200 in communication with a second apparatus, in the form of an external controller (e.g., processor 230), as part of a third apparatus, in the form of an electronic system, according to an embodiment. Some examples of electronic systems include computer servers, network devices, personal computers, personal digital assistants (PDAs), digital cameras, digital media players, digital recorders, games, appliances, vehicles, wireless devices, cellular telephones and the like.

Memory device 200 includes an array of memory cells 204 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column.

A row decode circuitry 208 and a column decode circuitry 210 are provided to decode address signals. Address signals are received and decoded to access the array of memory cells 204. Memory device 200 also includes input/output (I/O) control circuitry 212 to manage input of commands, addresses and data to the memory device 200 as well as output of data and status information from the memory device 200. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

Control logic 216 controls access to the array of memory cells 204 in response to the commands and generates status information for the external processor 230. The control logic 216 is in communication with row decode circuitry 208 and column decode circuitry 210 to control the row decode circuitry 208 and column decode circuitry 210 in response to the addresses. The control logic 216 may include a voltage control circuit in accordance with an embodiment. For example, the control logic 216 may provide voltages to the row decode circuitry 208 and/or the column decode circuitry 210 for use in accessing the array of memory cells 204. Control logic 216 may further include a trim register 226. Trim register 226 may store values indicative of a desired output voltage of a voltage control circuit in accordance with an embodiment. Values for storage in the trim register 226 may be read from non-volatile storage within the memory device 200, e.g., from the array of memory cells 204, such as in response to a power-up or reset of the memory device 200. Alternatively, or in addition, such values may be received from the processor 230 and written to the trim register 226, e.g., in response to a command received from the processor 230.

Control logic 216 is also in communication with a cache register 218. Cache register 218 latches data, either incoming or outgoing, as directed by control logic 216 to temporarily store data while the array of memory cells 204 is busy writing or reading, respectively, other data. During a program operation, data is passed from the cache register 218 to data register 220 for transfer to the array of memory cells 204; then new data is latched in the cache register 218 from the I/O control circuitry 212. During a read operation, data is passed from the cache register 218 to the I/O control circuitry 212 for output to the processor 230; then new data is passed from the data register 220 to the cache register 218. A status register 222 is in communication with I/O control circuitry 212 and control logic 216 to latch the status information for output to the processor 230.

Memory device 200 receives control signals at control logic 216 from processor 230 over a control link 232. The control signals may include at least a chip enable CE#, a command latch enable CLE, an address latch enable ALE, and a write enable WE#. Additional control signals (not shown) may be further received or provided over control link 232 depending upon the nature of the memory device 200. Memory device 200 receives command signals (which represent commands), address signals (which represent addresses), and data signals (which represent data) from processor 230 over a multiplexed input/output (I/O) bus 234 and outputs data to processor 230 over I/O bus 234.

For example, the commands are received over input/output (I/O) pins [7:0] of I/O bus 234 at I/O control circuitry 212 and are written into command register 224. The addresses are received over input/output (I/O) pins [7:0] of bus 234 at I/O control circuitry 212 and are written into address register 214. The data are received over input/output (I/O) pins [7:0] for an 8-bit device or input/output (I/O) pins [15:0] for a 16-bit device at I/O control circuitry 212 and are written into cache register 218. The data are subsequently written into data register 220 for programming the array of memory cells 204. For another embodiment, cache register 218 may be omitted, and the data are written directly into data register 220. Data, e.g., from the array of memory cells 204 or the status register 222, are also output over input/output (I/O) pins [7:0] for an 8-bit device or input/output (I/O) pins [15:0] for a 16-bit device. I/O control circuitry 212 may include data buffers (not shown) to buffer commands, addresses and data received by the I/O control circuitry 212, e.g., from the I/O bus 234, cache register 218 or status register 222.

It will be appreciated by those skilled in the art that additional circuitry and signals can be provided, and that the electronic system of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O and command pins are described in accordance with popular conventions for receipt and output of the various signals, it is noted that other combinations or numbers of pins may be used in various embodiments.

Figure 3:
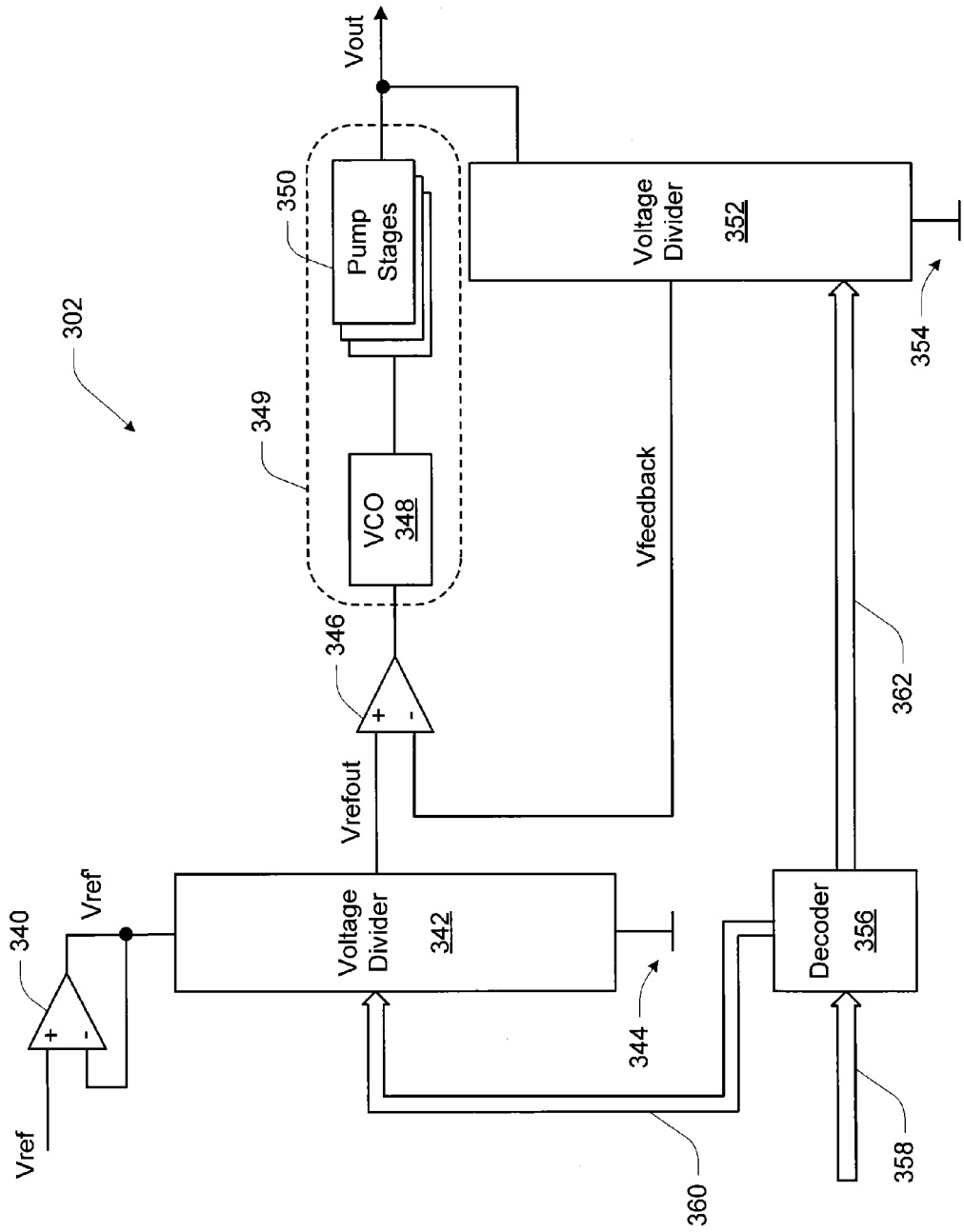
FIG. 3 is a simplified block diagram of a voltage control circuit in accordance with an embodiment.

FIG. 3 is a block diagram of a voltage control circuit 302 in accordance with an embodiment, which may be used for generation and control of either positive or negative output voltages (Vout). Voltage control circuit 302 is responsive to a reference voltage (Vref) and control signals 358 to generate and control an output voltage (Vout).

Reference voltages often have insufficient drive to provide input to a voltage divider. In cases where Vref has insufficient drive, voltage control circuit 302 may include an op-amp 340 having its positive input coupled to receive Vref. The op-amp 340 may be configured as a unity-gain amplifier, having its output (Vref) coupled to its negative input. As such, the output of op-amp 340 may also be deemed to be a reference voltage.

Vref may be provided to an input of voltage divider 342. Voltage divider 342 is an adjustable voltage divider, responsive to control signals 360. Voltage divider 342 is further coupled to a supply node 344. Supply node 344 may be coupled to receive a supply voltage, e.g., a ground potential. The output of the voltage divider 342 provides an adjusted reference voltage, Vrefout, which assumes a voltage level from Vref to the voltage level of the supply node 344, depending upon the resistance ratio of Rbot and Rtop of the voltage divider 342 as will be described in more detail with reference to FIG. 4.

Vrefout may be provided to the positive input of operational amplifier (op-amp) 346. As used herein, operational amplifier or op-amp will refer to any circuit configured to adjust (e.g., increase or decrease) a gain of its output in response to a signal differential, and to cease adjusting its gain as those signals approach equality. The output of op-amp 346 may be provided to a voltage-controlled oscillator (VCO) 348. VCO 348 provides an output (e.g., a clock signal) having a frequency that is a function of the output of the op-amp 346, and thus a function of the gain of the op-amp 346. The output of VCO 348 may be provided to one or more charge pump stages 350. Charge pump stages 350 represent any circuit capable of generating a voltage having a magnitude greater than a supply voltage provided to charge pump stages 350 and/or a polarity different than the supply voltage. The output of charge pump stages 350 (Vout) represents the voltage generated by the voltage control circuit 302. VCO 348 and charge pump stages 350 may be collectively referred to as a voltage generation circuit 349. Voltage generation circuit 349 may further include any circuit configured to generate a voltage level responsive to a level of an input control signal, e.g., the output of op-amp 346.

To adjust a voltage level of Vout, and to increase stability of the voltage level, Vout may be provided to voltage divider 352 for feedback to the op-amp 346. Voltage divider 352 is an adjustable voltage divider, responsive to control signals 362. Voltage divider 352 is further coupled to a supply node 354. Supply node 354 may be coupled to receive a supply voltage, e.g., a ground potential or core voltage. Alternatively, supply node 354 may be coupled to receive an internally-generated voltage, e.g., an output of a charge pump. The output of voltage divider 352, Vfeedback, assumes a voltage level from Vout to the voltage level of the supply node 354, depending upon the resistance ratio of Rbot and Rtop of the voltage divider 352 as will be described in more detail with reference to FIGS. 5A and 5B. Vfeedback is provided to the negative input of op-amp 346, thereby adjusting a gain of op-amp 346 until Vout assumes a voltage level sufficient to produce Vfeedback equal to Vrefout at steady-state.

A decoder 356 may output control signals 360 and 362 responsive to control signals 358 received as its inputs. For some embodiments, control signals 360 are the same control signals as control signals 362, e.g., voltage dividers 342 and 352 are responsive to a common set of control signals (e.g., the same control signals). Operation of one embodiment of a decoder 356 will be described with reference to FIG. 6.

Figure 4:
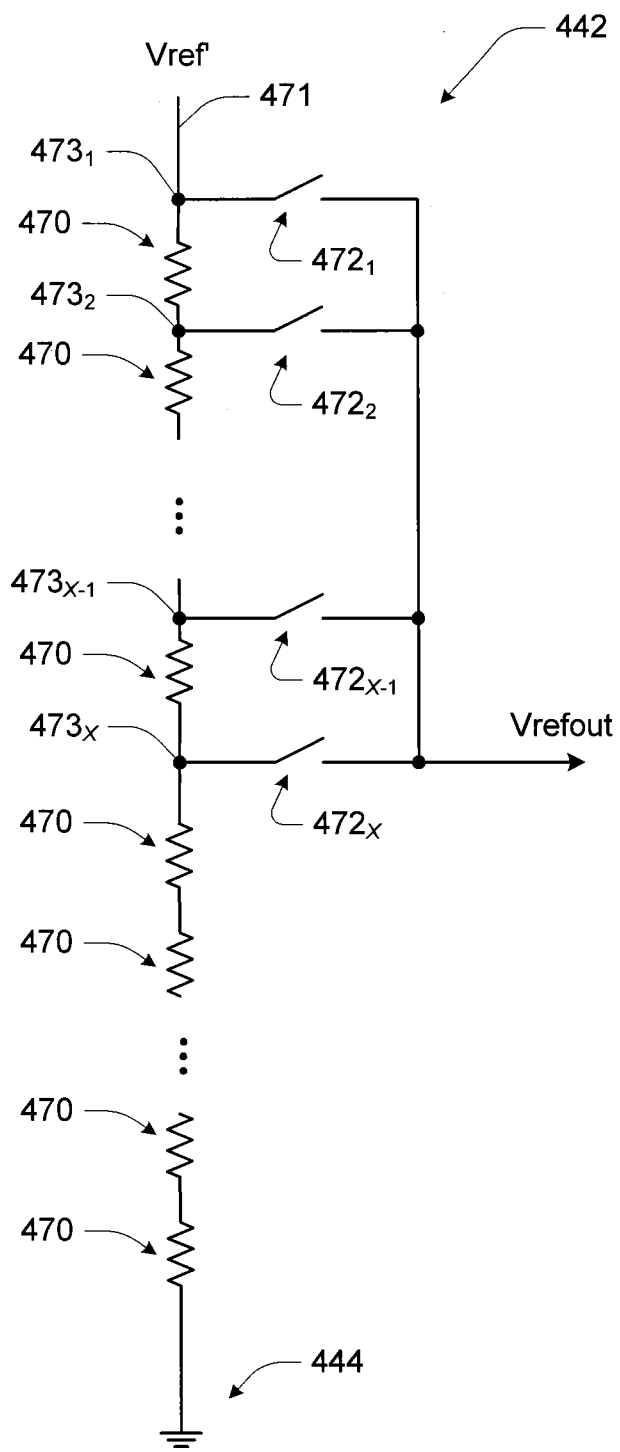
FIG. 4 is a schematic of a voltage divider for use in a voltage control circuit in accordance with an embodiment.

FIG. 4 is a schematic of a voltage divider 442 for use in a voltage control circuit in accordance with an embodiment. For example, voltage divider 442 may represent voltage divider 342 of FIG. 3. Voltage divider 442 includes two or more resistors 470 connected in series between an input 471 (e.g., entry point) and a supply node 444. Supply node 444 is coupled to receive a voltage that is less than a voltage of Vref. For one embodiment, supply node 444 is coupled to receive a ground potential. Voltage divider 442 further includes two or more switches 472 to selectively couple the output Vrefout to a corresponding one of two or more exit points 473. Switches 472 may represent n-type (p-channel) enhancement-mode field-effect transistors, for example. Resistors 470 may represent N-well resistors, for example.

Rtop of the voltage divider 442 would be represented by the resistance between the selected exit point 473 and the input 471, in this example. Where the resistors 470 are of equal value, this could further be represented by the number of resistors 470 between the selected exit point 473 and the input 471. Rbot of the voltage divider 442 would be represented by the resistance between the selected exit point 473 and the supply node 444, in this example. Where the resistors 470 are of equal value, this could further be represented by the number of resistors 470 between the selected exit point 473 and the supply node 444.

In operation, one of the switches 472 could be activated to select its corresponding exit point 473, thereby selecting a particular ratio of Rtop to Rbot of voltage divider 442. For example, activation of switch $472_1$ would couple the output Vrefout to exit point $473_1$ such that Vrefout would equal Vref. Activation of switch $472_2$ would couple the output Vrefout to exit point $473_2$ such that Vrefout would be less than Vref. And activation of any of the successive switches 472 (e.g., continuing toward switch $472_X$) would lead to ratios of Rtop to Rbot that are increasingly larger. In the operation of voltage control circuit 302 with voltage divider 442 as depicted, larger ratios of Rtop to Rbot would lead to smaller values of Vrefout, and vice versa. Although voltage divider 442 is depicted to have a fixed entry point 471 and selective exit points 473, it could be configured to have a fixed exit point and selective entry points to achieve similar results. Operation of such a voltage divider will be described with reference to FIGS. 5A and 5B.

Figure 5A:
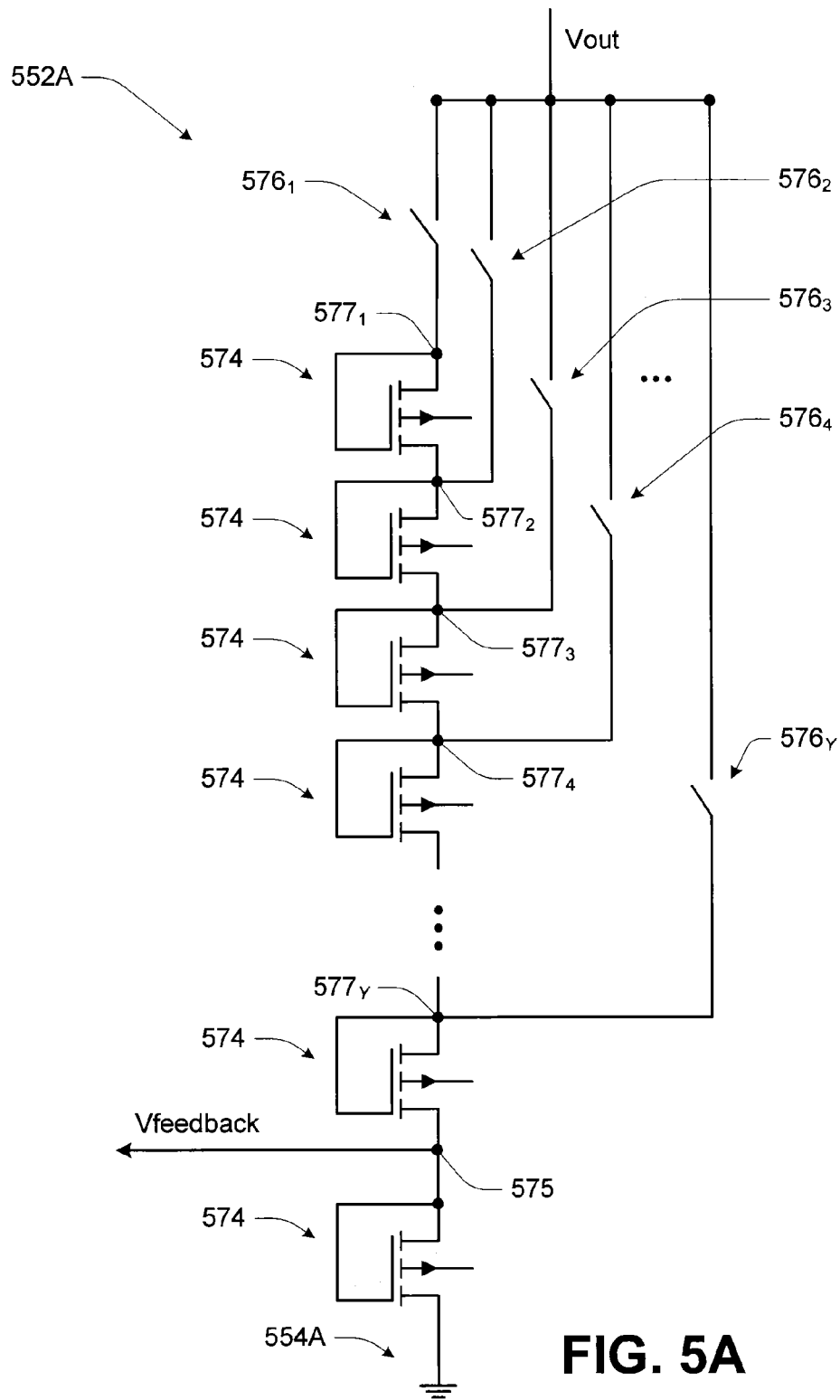
FIGS. 5A-5B are schematics of voltage dividers for use in voltage control circuits in accordance with embodiments.

FIG. 5A is a schematic of a voltage divider 552A for use in a voltage control circuit in accordance with an embodiment. For example, voltage divider 552A may represent voltage divider 352 of FIG. 3. Voltage divider 552A may be particularly useful in a voltage control circuit 302, for example, where Vout is a positive voltage.

Voltage divider 552A includes two or more resistors 574 connected in series. Voltage divider 552A further includes two or more switches 576 to selectively couple Vout to a corresponding one of two or more entry points 577. Switches 576 may represent field-effect transistors, for example. Resistors 574 may represent field-effect transistors (e.g., n-type [p-channel] enhancement-mode field-effect transistors) having their control gates connected to their drains, for example. Although not depicted in the schematic of FIG. 5A, transistors forming the resistors 574 may further have their bodies connected to their sources to mitigate body effect.

Rtop of the voltage divider 552A would be represented by the resistance between the selected entry point 577 and the exit point 575, in this example. Where the resistors 574 are of equal value (e.g., transistors of equal size), this could further be represented by the number of resistors 574 between the selected entry point 577 and the exit point 575. Rbot of the voltage divider 552A would be represented by the resistance between the exit point 575 and the supply node 554A, in this example. Where the resistors 574 are of equal value, this could further be represented by the number of resistors 574 between the exit point 575 and the supply node 554A. Supply node 554A is coupled to receive a voltage that is less than a voltage of Vout. For one embodiment, supply node 554A is coupled to receive a ground potential.

In operation, one of the switches 576 could be activated to select its corresponding entry point 577, thereby selecting a particular ratio of Rtop to Rbot of voltage divider 552A. For example, activation of switch $576_1$ would couple the input Vout to entry point $577_1$, activation of switch $576_2$ would couple the input Vout to entry point $577_2$, activation of switch $576_3$ would couple the input Vout to entry point $577_3$, and so on. Activation of any of the successive switches 576 (e.g., continuing toward switch $576_Y$) would lead to ratios of Rtop to Rbot that are increasingly smaller. In the operation of voltage control circuit 302 with voltage divider 552A as depicted, smaller ratios of Rtop to Rbot would lead to smaller values of Vout (e.g., positive values of lesser magnitude) and vice versa. Although voltage divider 552A is depicted to have a fixed exit point 575 and selective entry points 577, it could be configured to have a fixed entry point and selective exit points to achieve similar results. Operation of a voltage divider having a fixed entry point and selective exit points was described with reference to FIG. 4. Although voltage divider 552A is depicted to have one resistor 574 between its exit point 575 and the supply node 554A, differing numbers of resistors 574 could be provided between its exit point 575 and the supply node 554A.

Figure 5B:
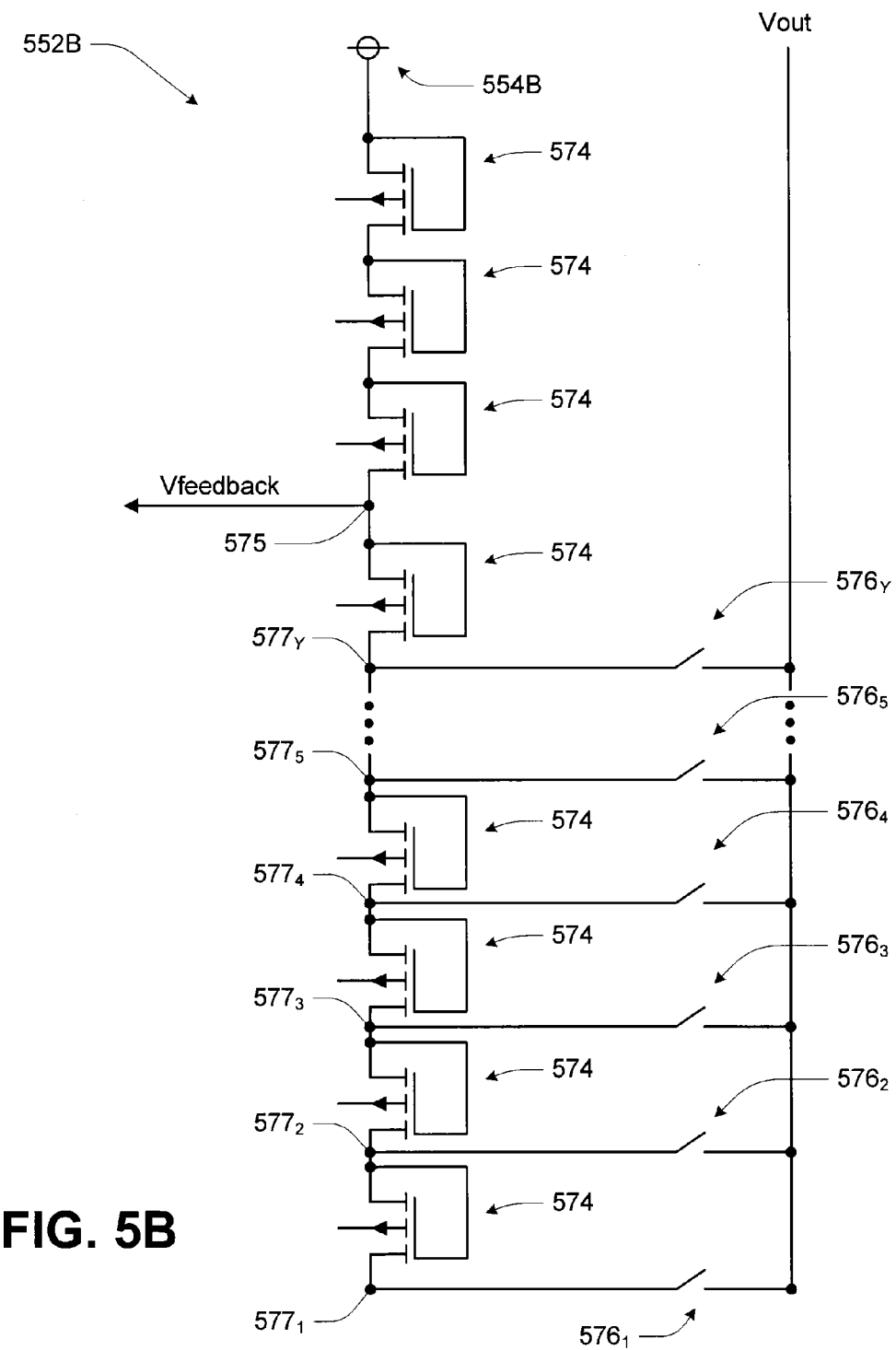

FIG. 5B is a schematic of a voltage divider 552B for use in a voltage control circuit in accordance with an embodiment. For example, voltage divider 552B may represent voltage divider 352 of FIG. 3. Voltage divider 552B may be particularly useful in a voltage control circuit 302, for example, where Vout is a negative voltage.

Voltage divider 552B includes two or more resistors 574 connected in series. Voltage divider 552B further includes two or more switches 576 to selectively couple the input Vout to a corresponding one of two or more entry points 577. Switches 576 may represent field-effect transistors, for example. Resistors 574 may represent field-effect transistors (e.g., n-type [p-channel] enhancement-mode field-effect transistors) having their control gates connected to their drains, for example. Although not depicted in the schematic of FIG. 5B, transistors forming the resistors 574 may further have their bodies connected to their sources to mitigate body effect.

Rtop of the voltage divider 552B would be represented by the resistance between the exit point 575 and the supply node 554B, in this example. Where the resistors 574 are of equal value, this would further be represented by the number of resistors 574 between the exit point 575 and the supply node 554B. Supply node 554B is coupled to receive a voltage that is greater than Vref, and thus greater than a voltage of Vout. This facilitates generating Vfeedback to a level of Vrefout. For one embodiment, supply node 554B is coupled to receive a core voltage. For another embodiment, supply node 554B is coupled to receive an internally-generated voltage, such as the output of another charge pump. Use of an internally-generated voltage may facilitate improvements in stability as internally-generated voltages are often more stable than an externally-supplied voltage. Rbot of the voltage divider 552B would be represented by the resistance between the selected entry point 577 and the exit point 575, in this example. Where the resistors 574 are of equal value (e.g., transistors of equal size), this would further be represented by the number of resistors 574 between the selected entry point 577 and the exit point 575.

In operation, one of the switches 576 could be activated to select its corresponding entry point 577, thereby selecting a particular ratio of Rtop to Rbot of voltage divider 552B. For example, activation of switch $576_1$ would couple the input Vout to entry point $577_1$, activation of switch $576_2$ would couple the input Vout to entry point $577_2$, activation of switch $576_3$ would couple the input Vout to entry point $577_3$, and so on. Activation of any of the successive switches 576 (e.g., continuing toward switch $576_Y$) would lead to ratios of Rtop to Rbot that are increasingly larger. In the operation of voltage control circuit 302 with voltage divider 552B as depicted, larger ratios of Rtop to Rbot would lead to larger values of Vout (e.g., negative values of lesser magnitude) and vice versa. Although voltage divider 552B is depicted to have a fixed exit point 575 and selective entry points 577, it could be configured to have a fixed entry point and selective exit points to achieve similar results. Operation of a voltage divider having a fixed entry point and selective exit points was described with reference to FIG. 4. Although voltage divider 552B is depicted to have four possible entry points $577_1$ to $577_4$, additional entry points could be provided. Similarly, although voltage divider 552B is depicted to have three resistors 574 between its exit point 575 and the supply node 554B, differing numbers of resistors 574 could be provided between its exit point 575 and the supply node 554B.

Figure 5C:
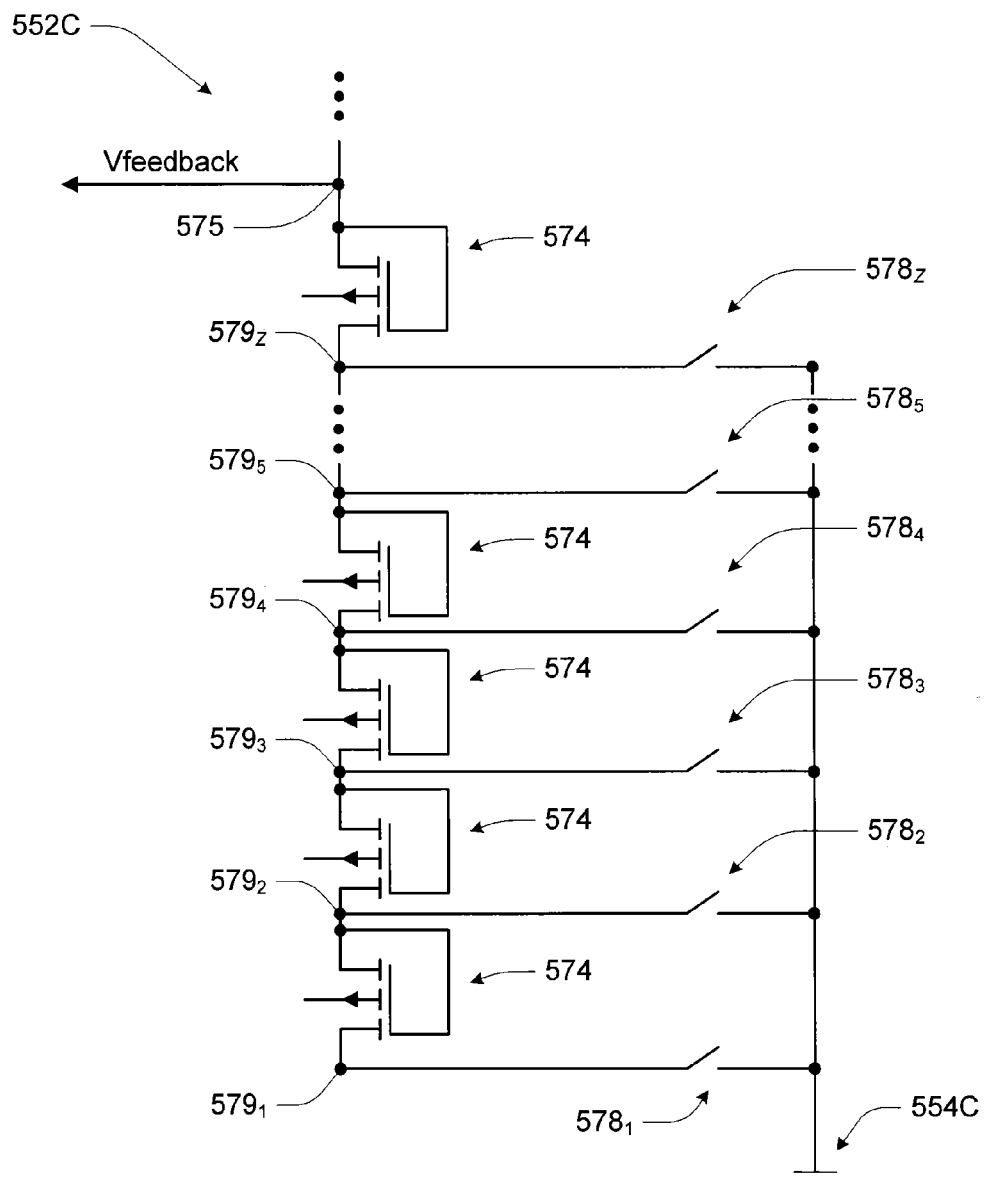
FIG. 5C is a schematic of a portion of a voltage divider for use in voltage control circuits in accordance with an embodiment.

Although the voltage divider 442 depicts selective exit points 473 for its output voltage, and voltage dividers 552A and 552B depict selective entry points for their input voltages, voltage dividers for use with various embodiments may further provide selective entry points for the supply voltage, or any combination thereof. FIG. 5C is a schematic of a portion of a voltage divider 552C for use in a voltage control circuit in accordance with an embodiment showing the use of selective entry points 579 for the supply node 554C.

Voltage divider 552C includes two or more resistors 574 connected in series. Voltage divider 552C further includes two or more switches 578 to selectively couple the supply node 554C to a corresponding one of two or more entry points 579. Switches 578 may represent field-effect transistors, for example. Resistors 574 may represent field-effect transistors (e.g., n-type [p-channel] enhancement-mode field-effect transistors) having their control gates coupled to their sources, for example.

The portion of voltage divider 552C depicted in FIG. 5C may correspond to Rbot of the voltage divider 552A, where the supply node 554C is coupled to receive a ground potential, for example. The portion of voltage divider 552C depicted in FIG. 5C might correspond to Rtop of the voltage divider 552B, where the supply node 554C is coupled to receive a voltage greater than Vfeedback, for example, if the control gate connections of resistors (e.g., transistors) 574 were reversed, i.e., connected to their drains.

In operation, one of the switches 578 could be activated to select its corresponding entry point 579. For example, activation of switch $578_1$ would couple the input Vout to entry point $579_1$, activation of switch $578_2$ would couple the input Vout to entry point $579_2$, activation of switch $578_3$ would couple the input Vout to entry point $579_3$, and so on.

The use of voltage dividers 342 and 352 for generating the input voltages to both the positive (Vrefout) and negative (Vfeedback) inputs to op-amp 340 of FIG. 3 facilitates an increased granularity of available output voltages (Vout) of the voltage control circuit 302 over use of voltage divider 352 alone. It may further be beneficial to control the output voltages of these voltage dividers in concert. For example, it may be desirable that an increasing value of control signals 358 to decoder 356 results in increasing (or decreasing) values of Vout. Such a benefit may be achieved through the use of combinatorial logic.

Figure 6:
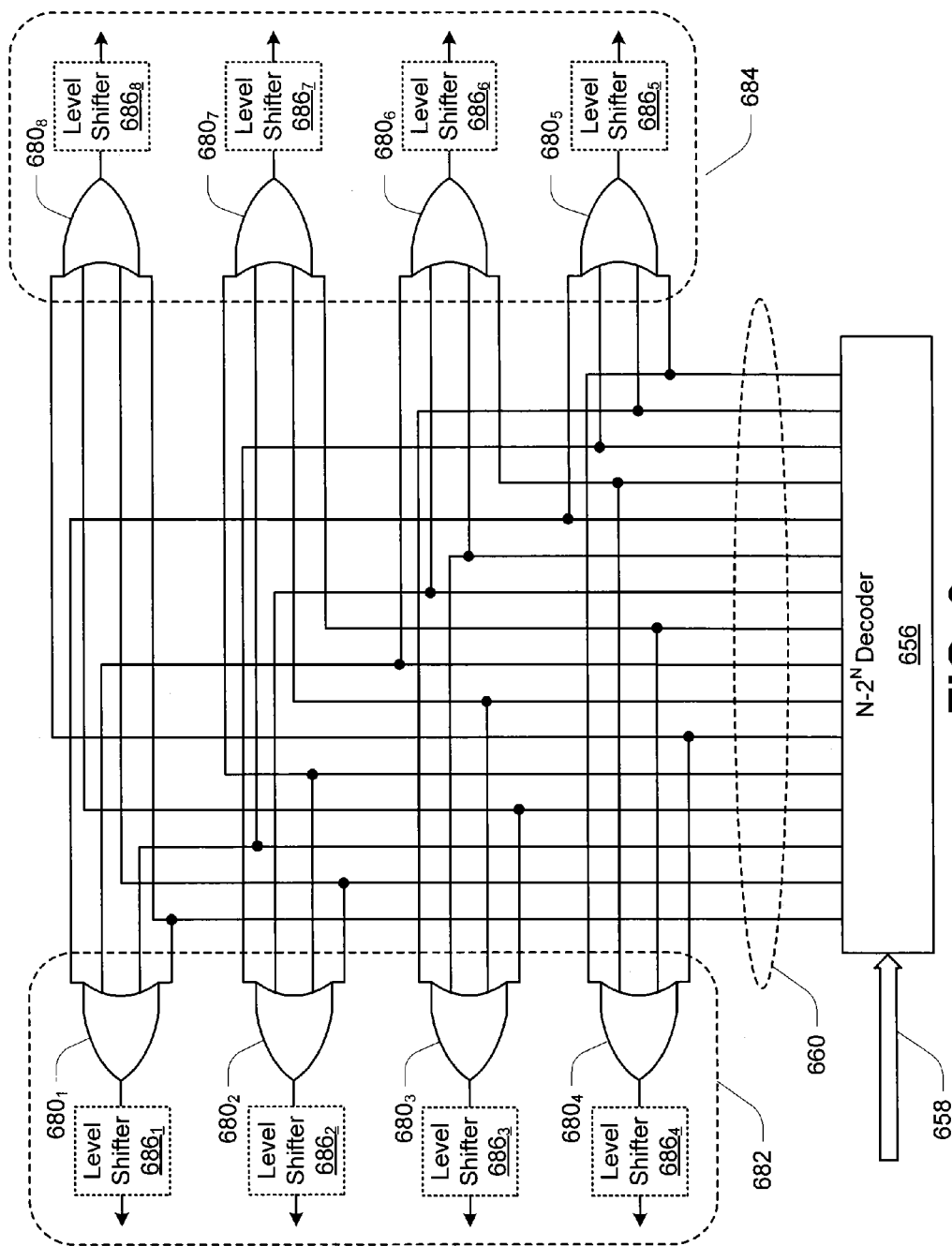
FIG. 6 is a block diagram depicting a decoder and combinatorial logic for use in a voltage control circuit in accordance with an embodiment.

FIG. 6 is a block diagram depicting a decoder 656 and combinatorial logic 682/684 for use in a voltage control circuit in accordance with an embodiment. For example, decoder 656 may represent decoder 356 of FIG. 3, combinatorial logic 682 may represent control logic for selectively activating switches 472 of voltage divider 442 of FIG. 4, and combinatorial logic 684 may represent control logic for selectively activating switches 576 of voltage divider 552A or 552B of FIG. 5A or 5B, respectively.

Decoder 656 is responsive to control signals 658 received at an input. For example, control signals 658 may be generated by control logic 216 in response to register values of trim register 226. Control signals 658 may further represent control signals 358 of FIG. 3. Decoder 656 of FIG. 6 is an N–$2^N$ decoder. In a typical N–$2^N$ decoder, the decoder receives N control signals 658 at its input, and provides $2^N$ control signals 660 at its output, with one control signal of control signals 660 having a logic high level, and remaining control signals of control signals 660 having logic low levels. In the example shown, control signals 658 include four control signals (N=4) and control signals 660 include sixteen control signals. Control signals 660 may represent both control signals 360 and 362 of FIG. 3. For example, combinatorial logic 682 and 684 may each receive the same control signals.

Combinatorial logic 682 and 684 may each include a number of OR-gates 680. For embodiments where combinatorial logic 682 selectively activates switches 472 of voltage divider 442, the output of each OR-gate 680 of combinatorial logic 682 may be provided to a corresponding switch 472, e.g., to a control gate of a transistor acting as a switch 472. For embodiments where combinatorial logic 684 selectively activates switches 576 of voltage divider 552A or 552B, the output of each OR-gate 680 of combinatorial logic 682 may be provided to a corresponding switch 576, e.g., to a control gate of a transistor acting as a switch 576. For embodiments where switches 472 and/or 576 are p-type (n-channel) enhancement-mode field-effect transistors, the corresponding OR-gates 680 could be replaced with NOR-gates to achieve a similar response. Where the output of the OR-gates 680 are unsuitable for activating the switches 472 or 576, level shifters 686 may be included to provide the appropriate voltage domain to the corresponding switches. For example, with reference to FIG. 4, where switches 472 may be passing voltages from Vrefout to Vref (e.g., less than Vcc), p-type enhancement mode field-effect transistors might be used without level shifters. With reference to FIG. 5A, where switches 576 may be passing voltages from Vfeedback to Vout (e.g., greater than Vcc), then p-type enhancement mode field-effect transistors might be used with level shifters. With reference to FIG. 5B, where switches 576 may be passing voltages from Vfeedback to Vout (e.g., less than a ground potential), then n-type enhancement mode field-effect transistors might be used with level shifters. And with reference to FIG. 5C in the scenario when supply node 554C is coupled to receive a ground potential, where switches 578 may be passing voltages from Vfeedback to the ground potential, then n-type enhancement mode field-effect transistors might be used without level shifters.

Consider the following example in conjunction with the foregoing figures:
Vref=Vref'=1.3V
Charge pumps stages 350 are configured to generate positive output voltages
Voltage divider 342 is voltage divider 442, voltage divider 442 includes fifteen resistors 470 in series and X=4, such that there are three resistors 470 between exit point $473_4$ ($473_X$) and input 471, two resistors 470 between exit point $473_3$ ($473_{X-1}$) and input 471, and one resistor 470 between exit point $473_2$ and input 471
Each resistor 470 is fabricated to be the same (e.g., same desired W/L)

Voltage divider 352 is voltage divider 552A and Y=7, such that there are seven resistors 574 between entry point $577_1$ and exit point 575, six resistors 574 between entry point $577_2$ and exit point 575, and so on Each resistor 574 is fabricated to be the same (e.g., same desired W/L)

Switches 472 and 576 are n-type (p-channel) enhancement-mode field-effect transistors OR-gate $680_1$ (Level Shifter $686_1$) has its output coupled to the control gate of switch $472_1$ OR-gate $680_2$ (Level Shifter $686_2$) has its output coupled to the control gate of switch $472_2$ OR-gate $680_3$ (Level Shifter $686_3$) has its output coupled to the control gate of switch $472_3$ OR-gate $680_4$ (Level Shifter $686_4$) has its output coupled to the control gate of switch $472_4$ OR-gate $680_5$ (Level Shifter $686_5$) has its output coupled to the control gate of switch $576_4$ OR-gate $680_6$ (Level Shifter $686_6$) has its output coupled to the control gate of switch $576_3$ OR-gate $680_7$ (Level Shifter $686_7$) has its output coupled to the control gate of switch $576_2$ OR-gate $680_8$ (Level Shifter $686_8$) has its output coupled to the control gate of switch $576_1$ Table 1 represents the various combinations available for exit points 473 of voltage divider 442, entry points 577 for voltage divider 552A, and their corresponding Rbot and Rtop values, as well as expected values of Vrefout and Vout, for the foregoing example. Rresbot represents Rbot of voltage divider 442, Rrestop represents Rtop of voltage divider 442, Rmosbot represents Rbot of voltage divider 552A, and Rmostop represents Rtop of voltage divider 552A.

TABLE 1

| Rresbot | Rrestop | Rmosbot | Rmostop | Vrefout | Vout |
|---|---|---|---|---|---|
| 15 | 0 | 1 | 7 | 1.30 | 10.40 |
| 14 | 1 | 1 | 7 | 1.21 | 9.71 |
| 13 | 2 | 1 | 7 | 1.13 | 9.01 |
| 12 | 3 | 1 | 7 | 1.04 | 8.32 |
| 15 | 0 | 1 | 6 | 1.30 | 9.10 |
| 14 | 1 | 1 | 6 | 1.21 | 8.49 |
| 13 | 2 | 1 | 6 | 1.13 | 7.89 |
| 12 | 3 | 1 | 6 | 1.04 | 7.28 |
| 15 | 0 | 1 | 5 | 1.30 | 7.80 |
| 14 | 1 | 1 | 5 | 1.21 | 7.28 |
| 13 | 2 | 1 | 5 | 1.13 | 6.76 |
| 12 | 3 | 1 | 5 | 1.04 | 6.24 |
| 15 | 0 | 1 | 4 | 1.30 | 6.50 |
| 14 | 1 | 1 | 4 | 1.21 | 6.07 |
| 13 | 2 | 1 | 4 | 1.13 | 5.63 |
| 12 | 3 | 1 | 4 | 1.04 | 5.20 |

In the foregoing example, where each resistor 470 is the same and each resistor 574 is the same, and supply nodes 444 and 554 are both coupled to receive a ground potential, the following equations may be considered (e.g., as extensions of Equation 2):

$$Vrefout = Vref \cdot Rresbot/(Rresbot+Rrestop) \quad \text{Eq. 3}$$

$$Vfeedback = Vout \cdot Rmosbot/(Rmosbot+Rmostop) \quad \text{Eq. 4}$$

Furthermore, at steady state, Vrefout equals Vfeedback. As a result, Equations 3 and 4 simplify to:

$$Vout = Vref \cdot Rresbot \cdot (Rmosbot+Rmostop)/(Rresbot+Rrestop)/Rmosbot \quad \text{Eq. 5}$$

Table 2 represents decoder input values (control signals 658), corresponding decoder output values (control signals 660, i.e., control signals 360 and 362), resulting logic results (High OR-gates 680), and corresponding output voltages (Vout) for the foregoing example.

TABLE 2

| Decoder Input | Decoder Output | High OR-Gates | Vout |
|---|---|---|---|
| 0000 | 0000000000000001 | $680_4$ and $680_5$ | 5.20 |
| 0001 | 0000000000000010 | $680_3$ and $680_5$ | 5.63 |
| 0010 | 0000000000000100 | $680_2$ and $680_5$ | 6.07 |
| 0011 | 0000000000001000 | $680_4$ and $680_6$ | 6.24 |
| 0100 | 0000000000010000 | $680_1$ and $680_5$ | 6.50 |
| 0101 | 0000000000100000 | $680_3$ and $680_6$ | 6.76 |
| 0110 | 0000000001000000 | $680_2$ and $680_6$ | 7.28 |
| 0111 | 0000000010000000 | $680_4$ and $680_7$ | 7.28 |
| 1000 | 0000000100000000 | $680_1$ and $680_6$ | 7.80 |
| 1001 | 0000001000000000 | $680_3$ and $680_7$ | 7.89 |
| 1010 | 0000010000000000 | $680_4$ and $680_8$ | 8.32 |
| 1011 | 0000100000000000 | $680_2$ and $680_7$ | 8.49 |
| 1100 | 0001000000000000 | $680_3$ and $680_8$ | 9.01 |
| 1101 | 0010000000000000 | $680_1$ and $680_7$ | 9.10 |
| 1110 | 0100000000000000 | $680_2$ and $680_8$ | 9.71 |
| 1111 | 1000000000000000 | $680_1$ and $680_8$ | 10.40 |

Figure 7:
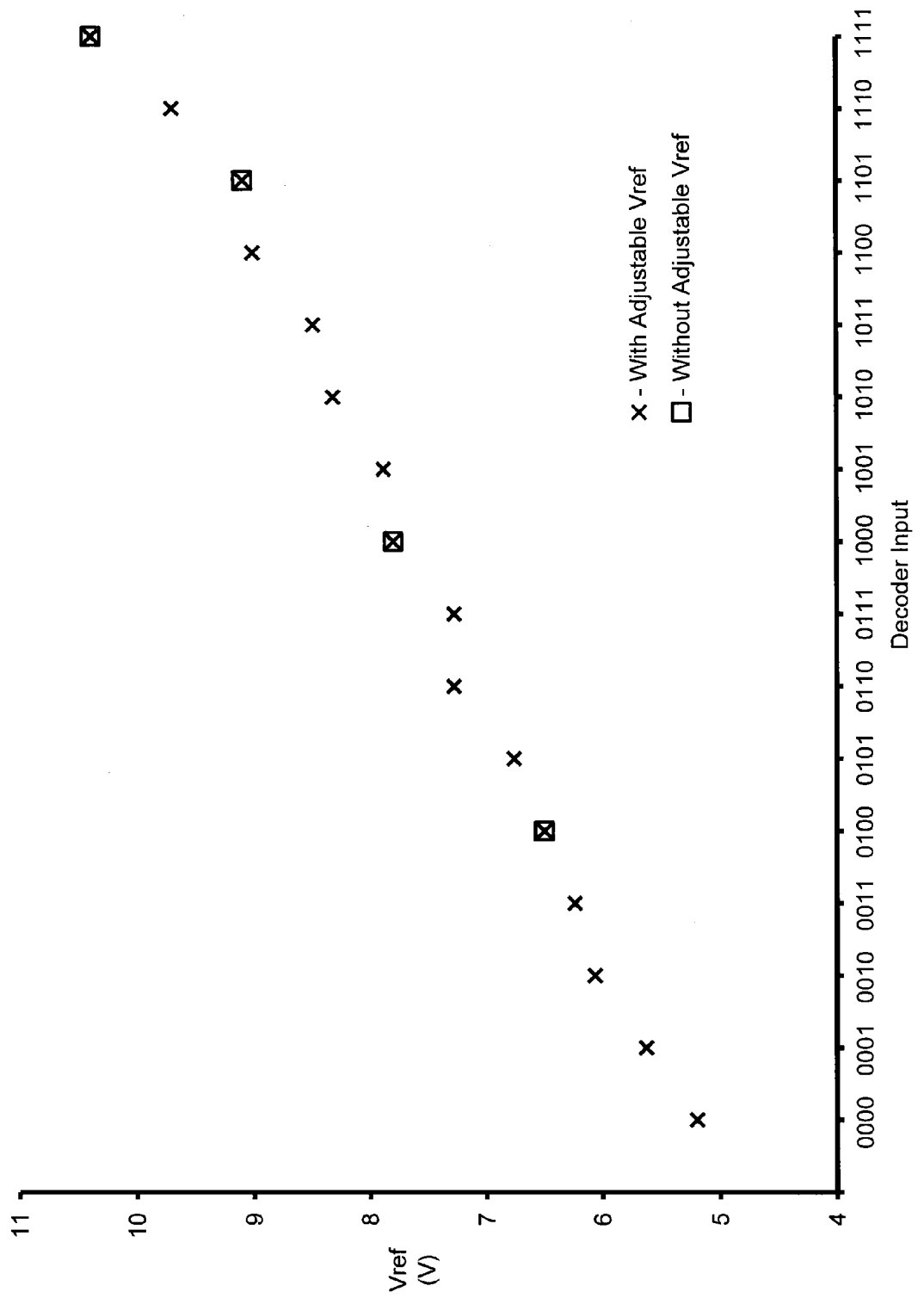
FIG. 7 is a graph corresponding to expected output voltages in accordance with an embodiment.

FIG. 7 is a graph corresponding to the expected output voltages for the foregoing example as a function of decoder input values showing an example of the increased granularity facilitated by the adjustable reference voltage. Values of Vout in FIG. 7 if Vref were not adjustable correspond to those values where Vrefout equals Vref, i.e., where OR-gate $680_1$ is logic high ("1") such that Rrestop is zero. Increases in granularity can be provided by increasing the number of resistors of the voltage dividers and/or increasing available entry/exit points of the voltage dividers, for example.

Although the foregoing example detailed a particular embodiment for generation and control of positive expected output voltages, a similar exercise could be carried out with reference to the generation and control of negative expected output voltages. For example, where charge pump stages 350 are configured to generate negative output voltages, and voltage divider 352 is voltage divider 552B, Equation 4 could be replaced with the following:

$$Vfeedback = (Vsup - Vout) \cdot Rmosbot/(Rmosbot+Rmostop)+Vout \quad \text{Eq. 6}$$

where: Vsup is the voltage level of supply node 554B

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An integrated circuit, comprising:
 a first voltage divider coupled to receive a reference voltage at an input and a supply voltage at a supply node, and having an output for providing an adjusted reference voltage;
 an operational amplifier having a first input coupled to receive the output of the first voltage divider, a second input coupled to receive a feedback voltage, and an output;
 a voltage generation circuit responsive to the output of the operational amplifier and having an output for providing an output voltage;
 a second voltage divider coupled to receive the output voltage at an input and having an output for providing the feedback voltage; and a combinatorial logic responsive to a common set of control signals to generate first control signals for control of the first voltage divider and second control signals for control of the second voltage divider;

wherein the first voltage divider comprises a plurality of resistors connected in series, and wherein the first voltage divider further comprises a plurality of exit points from the plurality of resistors selectively coupled to the output of the first voltage divider, with each exit point of the plurality of exit points of the first voltage divider configured to be coupled to the output of the first voltage divider with no intervening resistor of the plurality of resistors of the first voltage divider when selected to be coupled to the output of the first voltage divider;

wherein the second voltage divider comprises a second plurality of resistors connected in series, and wherein the second voltage divider further comprises a plurality of entry points to the second plurality of resistors selectively coupled to the input of the second voltage divider, with each entry point of the plurality of entry points of the second voltage divider configured to be coupled to the input of the second voltage divider with no intervening resistor of the plurality of resistors of the second voltage divider when selected to be coupled to the input of the second voltage divider;

wherein the combinatorial logic is configured such that a particular value of the common set of control signals generates a value of the first control signals to select a single exit point of the plurality of exit points of the first voltage divider and such that the particular value of the common set of control signals generates a value of the second control signals to select a single entry point of the plurality of entry points of the second voltage divider;

wherein the combinatorial logic is further configured such that a particular plurality of values of the common set of control signals each generate a respective value of the first control signals to select a same exit point of the plurality of exit points of the first voltage divider and such that the particular plurality of values of the common set of control signals each generate a respective value of the second control signals to select a different entry point of the plurality of entry points of the second voltage divider for each respective value of the second control signals; and wherein the combinatorial logic is further configured to generate a respective plurality of values of the first control signals configured to select each exit point of the plurality of exit points of the first voltage divider, and to generate a respective plurality of values of the second control signals configured to select each entry point of the plurality of entry points of the second voltage divider.

2. The integrated circuit of claim 1, wherein the plurality of resistors comprise a plurality of N-well resistors.

3. The integrated circuit of claim 2, wherein each N-well resistor of the plurality of N-well resistors is fabricated to be the same.

4. The integrated circuit of claim 1, wherein the second plurality of resistors comprise a plurality of field-effect transistors connected in series, source to drain, with a control gate of each transistor connected to its drain region to operate as a resistor.

5. The integrated circuit of claim 4, wherein each transistor of the plurality of field-effect transistors is fabricated to be the same.

6. The integrated circuit of claim 1, further comprising a decoder to provide the common set of control signals.

7. The integrated circuit of claim 6, wherein the decoder is an $N-2^N$ decoder.

8. The integrated circuit of claim 6, wherein increasing values of the common set of control signals results in increasing or decreasing values of the output voltage.

9. The integrated circuit of claim 1, further comprising a unity-gain amplifier having an output providing the reference voltage.

10. The integrated circuit of claim 1, wherein the voltage generation circuit is configured to produce a positive output voltage.

11. The integrated circuit of claim 1, wherein the voltage generation circuit is configured to produce a negative output voltage.

12. The integrated circuit of claim 1, wherein the second voltage divider is configured to connect the input of the second voltage divider to the supply node of the second voltage divider through a single contiguous portion of the second plurality of resistors regardless of a selection of any entry point to the second plurality of resistors for the input of the second voltage divider.

13. The integrated circuit of claim 1, wherein the combinatorial logic is further configured such that a different plurality of values of the common set of control signals each generate a respective value of the second control signals to select a same entry point of the plurality of entry points of the second voltage divider and such that the different plurality of values of the common set of control signals each generate a respective value of the first control signals to select a different exit point of the plurality of exit points of the first voltage divider.

14. An integrated circuit, comprising:

a first voltage divider having an input to receive a reference voltage and having an output for providing an adjusted reference voltage, wherein the first voltage divider comprises a plurality of first resistors connected in series between the input and a first supply node, and a plurality of exit points from the plurality of first resistors selectively coupled to the output of the first voltage divider;

an operational amplifier having a first input coupled to receive the output of the first voltage divider, a second input coupled to receive a feedback voltage, and an output;

a voltage generation circuit responsive to the output of the operational amplifier and having an output for providing an output voltage;

a second voltage divider having a plurality of entry points selectively coupled to the output of the voltage generation circuit, and an output for providing the feedback voltage, wherein the second voltage divider comprises a plurality of second resistors connected in series between a second supply node and the output of the voltage generation circuit;

a decoder configured to generate a plurality of control signals such that one control signal of the plurality of control signals has a first logic level and each remaining control signal of the plurality of control signals has a second logic level different than the first logic level; and a combinatorial logic responsive to the plurality of control signals to generate first control signals to couple the output of the first voltage divider to a single one of the exit points of the plurality of exits points of the first voltage divider regardless of which control signal of the plurality of control signals has the first logic level, and to generate second control signals to couple the output of the voltage generation circuit to a single one of the entry points of the plurality of entry points of the second voltage divider regardless of which control signal of the plurality of control signals has the first logic level;

wherein the combinatorial logic is configured to generate the first control signals to couple the output of the first voltage divider to a same exit point of the plurality of exit points of the first voltage divider when any control signal of a particular subset of control signals of the plurality of control signals has the first logic level and to generate the second control signals to couple the output of the voltage generation circuit to a different entry point of the plurality of entry points of the second voltage divider for each respective control signal of the particular subset of control signals of the plurality of control signals having the first logic level.

15. The integrated circuit of claim 14, wherein the voltage generation circuit comprises a voltage-controlled oscillator responsive to the output of the operational amplifier and one or more charge pump stages responsive to an output of the voltage-controlled oscillator.

16. The integrated circuit of claim 14, wherein the plurality of first resistors comprise a plurality of N-well resistors.

17. The integrated circuit of claim 16, wherein each N-well resistor of the plurality of N-well resistors is fabricated to be the same.

18. The integrated circuit of claim 14, wherein the plurality of second resistors comprise a plurality of field-effect transistors connected in series, source to drain, with a control gate of each transistor connected to its drain region to operate as a resistor.

19. The integrated circuit of claim 18, wherein each transistor of the plurality of field-effect transistors is fabricated to be the same.

20. The integrated circuit of claim 14, wherein the voltage generation circuit is configured to generate a negative output voltage, and wherein the second supply node is coupled to receive a voltage level greater than the reference voltage.

21. The integrated circuit of claim 14, wherein the voltage generation circuit is configured to generate a positive output voltage, and wherein the second supply node is coupled to receive a ground potential.

22. The integrated circuit of claim 14, wherein the combinatorial logic is further configured to generate the second control signals to couple the output of the voltage generation circuit to a same entry point of the plurality of entry points of the second voltage divider when any control signal of a different subset of control signals of the plurality of control signals has the first logic level and to generate the first control signals to couple the output of the first voltage divider to a different exit point of the plurality of exit points of the first voltage divider for each respective control signal of the different subset of control signals of the plurality of control signals having the first logic level.

23. The integrated circuit of claim 22, wherein the particular subset of control signals of the plurality of control signals comprises a particular number of control signals equal to a number of exit points of the plurality of exit points of the first voltage divider and equal to a number of entry points of the plurality of entry points of the second voltage divider, and wherein the different subset of control signals of the plurality of control signals comprises a number of control signals equal to the particular number.

24. An integrated circuit device, comprising:
an array of memory cells;
a voltage control circuit to provide voltages to the array of memory cells, wherein the voltage control circuit comprises:
a first voltage divider coupled to receive a reference voltage at an input and to receive a first supply voltage at a first supply node, and having an output for providing an adjusted reference voltage;
an operational amplifier having a first input coupled to receive the output of the first voltage divider, a second input coupled to receive a feedback voltage, and an output;
a voltage generation circuit responsive to the output of the operational amplifier and having an output for providing an output voltage to the array of memory cells;
a second voltage divider coupled to receive the output voltage at an input and to receive a second supply voltage at a second supply node, and having an output for providing the feedback voltage;
a decoder configured to generate a plurality of control signals; and
a combinatorial logic, wherein the combinatorial logic is configured to receive the plurality of control signals from the decoder, to use the plurality of control signals to generate first control signals to the first voltage divider to adjust a voltage level of the adjusted reference voltage, and to use the plurality of control signals to generate second control signals to the second voltage divider to adjust a voltage level of the feedback voltage;
wherein, for a particular subset of control signals of the plurality of control signals, the combinatorial logic is configured to generate the first control signals to adjust a ratio of a series resistance between the input and the output of the first voltage divider to a series resistance between the output and the first supply node of the first voltage divider to a same value for each value of the particular subset of control signals of the plurality of control signals;
wherein, for the particular subset of control signals of the plurality of control signals, the combinatorial logic is configured to generate the second control signals to adjust a ratio of a series resistance between the input and the output of the second voltage divider to a series resistance between the output and the second supply node of the second voltage divider to different values for each respective value of the particular subset of control signals of the plurality of control signals;
wherein, for a different subset of control signals of the plurality of control signals, the combinatorial logic is configured to generate the first control signals to adjust the ratio of the series resistance between the input and the output of the first voltage divider to the series resistance between the output and the first supply node of the first voltage divider to different values for each respective value of the different subset of control signals of the plurality of control signals; and
wherein, for the different subset of control signals of the plurality of control signals, the combinatorial logic is configured to generate the second control signals to adjust the ratio of the series resistance between the input and the output of the second voltage divider to the series resistance between the output and the second supply node of the second voltage divider to a same value for each value of the different subset of control signals of the plurality of control signals.

25. The integrated circuit of claim 24, further comprising:
wherein, for the particular subset of control signals of the plurality of control signals and increasing values of the plurality of control signals, the combinatorial logic is configured to generate the second control signals to adjust the ratio of the series resistance between the input and the output of the second voltage divider to the series resistance between the output and the second supply node of the second voltage divider to decreasing values for each respective value of the particular subset of control signals of the plurality of control signals; and
wherein, for the different subset of control signals of the plurality of control signals and increasing values of the plurality of control signals, the combinatorial logic is configured to generate the first control signals to adjust the ratio of the series resistance between the input and the output of the first voltage divider to the series resistance between the output and the first supply node of the first voltage divider to increasing values for each respective value of the different subset of control signals of the plurality of control signals.

* * * * *